(12) United States Patent
Cho et al.

(10) Patent No.: US 8,501,375 B2
(45) Date of Patent: Aug. 6, 2013

(54) POSITIVE PHOTOSENSITIVE RESIN COMPOSITION

(75) Inventors: Hyun-Yong Cho, Uiwang-si (KR); Min-Kook Chung, Uiwang-si (KR); Ji-Young Jeong, Uiwang-si (KR); Jong-Hwa Lee, Uiwang-si (KR); Yong-Sik Yoo, Uiwang-si (KR); Jeong-Woo Lee, Uiwang-si (KR); Hwan-Sung Cheon, Uiwang-si (KR); Soo-Young Kim, Seongnam-si (KR); Young-Ho Kim, Yongin-si (KR); Jae-Hyun Kim, Yongin-si (KR); Su-Min Park, Seoul (KR)

(73) Assignee: Cheil Industries Inc., Gum-si (KR)

( * ) Notice: Subject to any disclaimer, the term of this patent is extended or adjusted under 35 U.S.C. 154(b) by 0 days.

(21) Appl. No.: 13/241,612

(22) Filed: Sep. 23, 2011

(65) Prior Publication Data

US 2012/0156616 A1 Jun. 21, 2012

(30) Foreign Application Priority Data

Dec. 20, 2010 (KR) .................... 10-2010-0130786

(51) Int. Cl.
*G03F 7/023* (2006.01)

(52) U.S. Cl.
CPC .................... *G03F 7/0233* (2013.01)
USPC ............ 430/18; 430/165; 430/191; 430/192; 430/193

(58) Field of Classification Search
CPC ................................ G03F 7/0233
USPC ............................ 430/191, 192, 193, 18, 165
See application file for complete search history.

(56) References Cited

U.S. PATENT DOCUMENTS

| | | | |
|---|---|---|---|
| 2,772,975 A | 12/1956 | Rickers | |
| 2,797,213 A | 6/1957 | Moore | |
| 3,669,658 A | 6/1972 | Yonezawa et al. | |
| 4,289,699 A | 9/1981 | Oba et al. | |
| 4,400,521 A | 8/1983 | Oba et al. | |
| 5,077,378 A | 12/1991 | Mueller et al. | |
| 5,858,584 A | 1/1999 | Okabe et al. | |
| 6,143,467 A | 11/2000 | Hsu et al. | |
| 6,214,516 B1 * | 4/2001 | Waterson et al. | 430/191 |
| 6,593,043 B2 | 7/2003 | Suwa et al. | |
| 6,927,012 B2 | 8/2005 | Hatanaka et al. | |
| 6,927,013 B2 | 8/2005 | Banba et al. | |
| 6,929,890 B2 | 8/2005 | Miyoshi et al. | |
| 7,101,652 B2 | 9/2006 | Naiini et al. | |
| 7,129,011 B2 | 10/2006 | Rushkin et al. | |
| 7,238,455 B2 | 7/2007 | Banba et al. | |
| 7,361,445 B2 | 4/2008 | Banba et al. | |
| 7,416,822 B2 | 8/2008 | Kanada et al. | |
| 7,615,331 B2 | 11/2009 | Yamanaka et al. | |
| 7,687,208 B2 | 3/2010 | Shibui | |
| 8,080,350 B2 | 12/2011 | Banba et al. | |
| 8,088,882 B2 | 1/2012 | Sakayori | |
| 8,198,002 B2 * | 6/2012 | Jung et al. | 430/191 |
| 2002/0090564 A1 | 7/2002 | Suwa et al. | |
| 2004/0197703 A1 | 10/2004 | Miyoshi et al. | |
| 2004/0253537 A1 | 12/2004 | Rushkin et al. | |
| 2006/0216641 A1 | 9/2006 | Schubel et al. | |
| 2007/0154843 A1 | 7/2007 | Kanada et al. | |
| 2009/0214860 A1 | 8/2009 | Enoki et al. | |
| 2010/0099043 A1 | 4/2010 | Jung et al. | |
| 2011/0003248 A1 | 1/2011 | Jung et al. | |
| 2011/0009506 A1 | 1/2011 | Lee et al. | |
| 2011/0111346 A1 * | 5/2011 | Jeong et al. | 430/286.1 |
| 2012/0156616 A1 | 6/2012 | Cho et al. | |

FOREIGN PATENT DOCUMENTS

| | | |
|---|---|---|
| CN | 101727006 A | 6/2010 |
| EP | 0557991 A1 | 9/1993 |
| EP | 1491952 A2 | 12/2004 |
| JP | 63-096162 | 4/1988 |
| JP | 07-281441 A | 10/1995 |
| JP | 09-302221 | 11/1997 |
| JP | 10-307393 | 11/1998 |
| JP | 11-338157 | 12/1999 |
| JP | 2000-292913 | 10/2000 |
| JP | 2003-248314 A | 9/2003 |
| JP | 2006-071663 | 3/2006 |
| JP | 2006-091772 A | 4/2006 |

(Continued)

OTHER PUBLICATIONS

International Search Report in commonly owned International Application No. PCT/KR2008/0074906, dated Aug. 10, 2009, pp. 1-3.
International Written Opinion in commonly owned International Application No. PCT/KR2008/007906, dated Aug. 10, 2009, pp. 1-3.
Office Action in commonly owned U.S. Appl. No. 13/242,120, mailed Dec. 21, 2012, pp. 1-9.
Office Action in commonly owned U.S. Appl. No. 12/834,933, mailed Jun. 19, 2012, pp. 1-8.
Notice of Allowance in commonly owned U.S. Appl. No. 12/834,933, mailed Dec. 17, 2012, pp. 1-9.
Office Action in commonly owned U.S. Appl. No. 12/884,316, mailed Jul. 6, 2012, pp. 1-8.
Final Office Action in commonly owned U.S. Appl. No. 12/884,316, mailed Jan. 28, 2013, pp. 1-9.

(Continued)

*Primary Examiner* — John Chu
(74) *Attorney, Agent, or Firm* — Summa, Additon & Ashe, P.A.

(57) ABSTRACT

Disclosed is a positive photosensitive resin composition that includes (A) a polybenzoxazole precursor including a repeating unit represented by the following Chemical Formula 1; (B) a photosensitive diazoquinone compound; (C) a silane compound; (D) a phenol compound; and (E) a solvent.

[Chemical Formula 1]

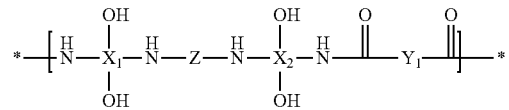

In the above Chemical Formula 1, each substituent is the same as defined in the specification.

10 Claims, No Drawings

FOREIGN PATENT DOCUMENTS

| | | | |
|---|---|---|---|
| JP | 2006-349700 | A | 12/2006 |
| JP | 2007-017726 | A | 1/2007 |
| JP | 2007-079264 | A | 3/2007 |
| JP | 2007-176805 | A | 7/2007 |
| JP | 2008-535003 | | 8/2008 |
| JP | 2008-230984 | | 10/2008 |
| JP | 2009-035495 | | 2/2009 |
| JP | 2009-155481 | A | 7/2009 |
| KR | 10-0264691 | B | 9/2000 |
| KR | 10-2001-011635 | A | 2/2001 |
| KR | 10-2002-0041302 | A | 6/2002 |
| KR | 10-2003-0053471 | A | 6/2003 |
| KR | 10-2006-0004908 | A | 1/2006 |
| KR | 10-2008-0029919 | A | 4/2008 |
| KR | 10-2008-040569 | A | 5/2008 |
| KR | 10-2008-0053382 | A | 6/2008 |
| KR | 10-2009-0097679 | A | 9/2009 |
| KR | 10-2010-0042947 | A | 4/2010 |
| KR | 10-2010-0053798 | A | 5/2010 |
| KR | 10-2010-0110580 | A | 10/2010 |
| TW | 200504464 | | 2/2005 |
| WO | 2004/109400 | | 12/2004 |
| WO | 2006/104803 | A2 | 10/2006 |
| WO | 2007/063721 | A1 | 6/2007 |
| WO | 2008/020573 | A1 | 2/2008 |
| WO | 2009/116724 | A1 | 9/2009 |

OTHER PUBLICATIONS

Taiwanese Search Report in counterpart Taiwanese Application No. 098143652 dated Jan. 2, 2013, pp. 1.

Office Action in commonly owned U.S. Appl. No. 12/834,933 mailed on Jun. 19, 2012, pp. 1-8.

Chinese Search Report in counterpart Chinese Application No. 2011103743252 dated Feb. 1, 2013, pp. 1-4.

* cited by examiner

POSITIVE PHOTOSENSITIVE RESIN COMPOSITION

CROSS-REFERENCE TO RELATED APPLICATION

This application claims priority under 35 USC Section 119 to and the benefit of Korean Patent Application No. 10-2010-0130786 filed in the Korean Intellectual Property Office on Dec. 20, 2010, the entire disclosure of which is incorporated herein by reference.

FIELD OF THE INVENTION

The present invention relates to a positive photosensitive resin composition, a photosensitive resin film fabricated by using the positive photosensitive resin composition, and a semiconductor device including the photosensitive resin film.

BACKGROUND OF THE INVENTION

The conventional surface protective layer and interlayer insulating layer for a semiconductor device includes a polyimide resin which can have excellent heat resistance, electrical characteristics, mechanical characteristics, and the like.

The polyimide resin has recently been used as a photosensitive polyimide precursor composition which can be coated easily. The photosensitive polyimide precursor composition is coated on a semiconductor device, patterned by ultraviolet (UV) rays, developed, and heat imidized, to easily provide a surface protective layer, an interlayer insulating layer, and the like.

Accordingly, it is possible to significantly shorten the processing time compared with that of a conventional non-photosensitive polyimide precursor composition.

The photosensitive polyimide precursor composition can be applied as a positive type in which an exposed part is dissolved by development, or a negative type in which the exposed part is cured and maintained. Positive type compositions can be developed by a non-toxic alkali aqueous solution.

The positive photosensitive polyimide precursor composition can include a polyimide precursor of polyamic acid, a photosensitive material of diazonaphthoquinone, and the like. However, it can be difficult to obtain a desired pattern using the positive photosensitive polyimide precursor composition because the carbonic acid of the polyamic acid is too highly soluble in an alkali.

In order to solve this problem, a material to which a phenolic hydroxyl acid has been introduced instead of carbonic acid by esterifying polyamic acid with an alcohol compound having at least one hydroxyl group has been proposed, but this material is insufficiently developed, causing problems of layer loss or resin delamination from the substrate.

Recently, a material in which a polybenzoxazole precursor is mixed with a diazonaphthoquinone compound has drawn attention, but when the polybenzoxazole precursor composition is actually used, layer loss of an unexposed part can be significantly increased, so it is difficult to obtain a desirable pattern after the developing process.

In order to improve this, if the molecular weight of the polybenzoxazole precursor is increased, the layer loss amount of the unexposed part is reduced, but development residue (scum) is generated, so resolution may be decreased and the development duration on the exposed part may be increased.

In order to solve this problem, layer loss may be suppressed in non-exposed parts during development by adding a certain phenol compound to a polybenzoxazole precursor composition. However, the effect of suppressing the layer loss of the unexposed part is insufficient. Accordingly, there is still a need to increase the effects on suppressing layer loss, along with preventing generation of development residue (scum).

In addition, since the phenol for controlling solubility may decompose or participate in side reactions at a high temperature during thermosetting, which can significantly damage the mechanical properties of the resultant cured layer, there is still a need for a substitute for the dissolution controlling agent. In addition, there is a need to improve sensitivity in order to improve the productivity of electronic devices along with maintaining a similar or improved level of optical properties such as resolution as compared to conventional materials.

SUMMARY OF THE INVENTION

One embodiment provides a positive photosensitive resin composition that can have high sensitivity, high resolution, good pattern formation properties and excellent residue removal properties. Another embodiment provides a photosensitive resin film fabricated by using the positive photosensitive resin composition. A further embodiment provides a semiconductor device including the photosensitive resin film. The embodiments of the present invention are not limited to the above technical purposes, and a person of ordinary skill in the art can understand other technical purposes.

According to an embodiment, a positive photosensitive resin composition is provided that includes (A) a polybenzoxazole precursor including a repeating unit represented by the following Chemical Formula 1, (B) a photosensitive diazoquinone compound, (C) a silane compound, (D) a phenol compound, and (E) a solvent.

[Chemical Formula 1]

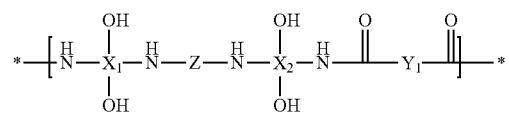

In the above Chemical Formula, $X_1$ and $X_2$ are the same or different and are each independently an aromatic organic group or a tetravalent to hexavalent aliphatic organic group, $Y_1$ is an aromatic organic group or a divalent to hexavalent aliphatic organic group, and Z is

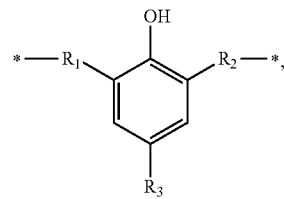

wherein:

$R_1$ and $R_2$ are the same or different and are each independently C1 to C6 alkylene, and $R_3$ is C1 to C6 alkyl.

The polybenzoxazole precursor may be a copolymer that further includes a repeating unit represented by the following Chemical Formula 2, Chemical Formula 3, or a combination thereof.

[Chemical Formula 2]

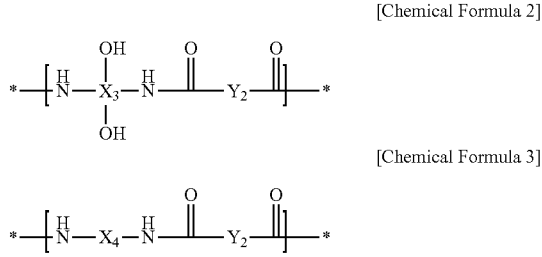

[Chemical Formula 3]

wherein, in the above Chemical Formula, $X_3$ is an aromatic organic group or a tetravalent to hexavelent aliphatic organic group, $X_4$ is an aromatic organic group, a divalent to hexavalent aliphatic organic group, or a divalent to hexavalent alicyclic organic group, and $Y_2$ are the same or different and are each independently an aromatic organic group or a divalent to hexavalent aliphatic organic group.

The polybenzoxazole precursor may include the repeating unit represented by the above Chemical Formula 1 and the repeating unit represented by the above Chemical Formula 2, Chemical Formula 3 or a combination of the above Chemical Formula 2 and Chemical Formula 3 at a mole ratio of m:n (wherein m+n=100 mol %, m ranges from about 5 to about 100 mol %, and n ranges from about 0 to about 95 mol %. In one embodiment of the present invention, m ranges from about 5 to about 75 mol %, and n ranges from about 25 to about 95 mol %.

The polybenzoxazole precursor may have a weight average molecular weight (Mw) of about 3,000 to about 300,000.

In another embodiment of the present invention, the repeating unit represented by Chemical Formula 1 of the polybenzoxazole precursor may be derived from a diamine compound represented by the following Chemical Formula 4.

Examples of the solvent may include without limitation N-methyl-2-pyrrolidone, γ-butyrolactone, N,N-dimethyl acetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like, and combinations thereof.

In exemplary embodiments of the present invention, the resin composition may include about 5 to about 100 parts by weight of the photosensitive diazoquinone compound (B), about 0.1 to about 30 parts by weight of the silane compound (C), about 1 to about 30 parts by weight of the phenol compound (D), and about 100 to about 400 parts by weight of solvent (E) based on about 100 parts by weight of the polybenzoxazole precursor (A).

According to another embodiment, a photosensitive resin film made using the positive photosensitive resin composition is provided.

According to a further embodiment, a semiconductor device including the photosensitive resin film is provided.

The positive photosensitive resin composition can have high sensitivity, high resolution, good pattern formation properties, and excellent residue removal properties.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least a substituent comprising halogen (F), hydroxyl, nitro, cyano, amino (—$NH_2$, —NH(R), —N(R')(R''), R, wherein R' and R'' are the same or different and are independently C1 to C10 alkyl), amidino, hydrazine, hydrazone, carboxyl, alkyl, aryl, alkenyl, alkynyl, heteroaryl, heterocyclic, or a combination thereof, in place of at least one hydrogen of a functional group.

As used herein, when a specific definition is not otherwise provided, the term "alkyl" refers to C1 to C30 alkyl, for example C1 to C16 alkyl, the term "alkylene" refers to C1 to C30 alkylene, for example C1 to C16 alkylene, the term

[Chemical Formula 4]

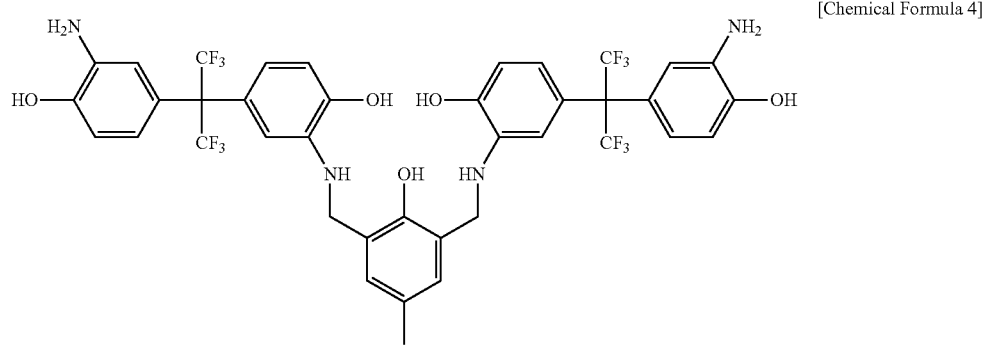 [SMILES: Cc1cc(CNc2cc(C(c3ccc(O)c(N)c3)(C(F)(F)F)C(F)(F)F)ccc2O)c(O)c(CNc2cc(C(c3ccc(O)c(N)c3)(C(F)(F)F)C(F)(F)F)ccc2O)c1]

"alkenyl" refers to C2 to C30 alkenyl, for example C2 to C16 alkenyl, the term "alkynyl" refers to C2 to C30 alkynyl, for example C2 to C16 alkynyl, the term "alkoxy" refers to C1 to C30 alkoxy, for example C1 to C16 alkoxy, the term "aryl" refers to C6 to C30 aryl, for example C6 to C18 aryl, the term "arylene" refers to C6 to C30 arylene, for example C6 to C18 arylene, the term "heteroaryl" refers to C2 to C30 heteroaryl, for example C1 to C16 heteroaryl, and the term "heterocyclic" refers to C2 to C30 heterocyclic, for example C2 to C18 heterocyclic.

As used herein, when a specific definition is not otherwise provided, the term "aliphatic organic group" refers to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" and "alicyclic group" refers to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "aromatic organic group" refers to C6 to C30 aryl, C2 to C30 heteroaryl, C6 to C30 arylene, or C2 to C30 heteroarylene, for example C6 to C16 aryl, C2 to C16 heteroaryl, C6 to C16 arylene, or C2 to C16 heteroarylene.

As used herein, when a specific definition is not otherwise provided, the term "hetero" may refer to one including at least one heteroatom of N, O, S, P, or a combination thereof in place of a carbon ring atom.

As used herein, when a specific definition is not otherwise provided, the term "combination" refers to mixing or copolymerization. Also, the term "copolymerization" refers to block copolymerization or random copolymerization, and the term "copolymer" refers to a block copolymer or a random copolymer.

Also, "*" refers to a linking part between the same or different atoms, or chemical Formulas.

According to one embodiment, the photosensitive resin composition includes (A) a polybenzoxazole precursor including a repeating unit represented by the following Chemical Formula 1; (B) a photosensitive diazoquinone compound; (C) a silane compound; (D) a phenol compound; and (E) a solvent. Hereinafter, each composition component of the photosensitive resin composition is described in detail.

(A) Polybenzoxazole Precursor

The polybenzoxazole precursor includes a repeating unit represented by the following Chemical Formula 1.

[Chemical Formula 1]

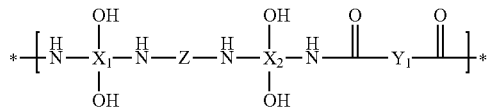

wherein, in the above Chemical Formula, $X_1$ and $X_2$ are the same or different and are each independently an aromatic organic group or a tetravalent to hexavalent aliphatic organic group, $Y_1$ is an aromatic organic group or a divalent to hexavalent aliphatic organic group, and Z is

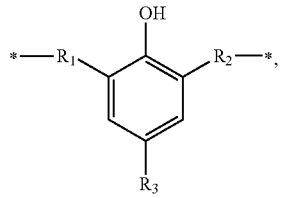

wherein:

$R_1$ and $R_2$ are the same or different and are each independently C1 to C6 alkylene, and $R_3$ is C1 to C6 alkyl.

The polybenzoxazole precursor may further include a repeating unit represented by the following Chemical Formula 2, Chemical Formula 3, or a combination of Chemical Formula 2 and Chemical Formula 3.

[Chemical Formula 2]

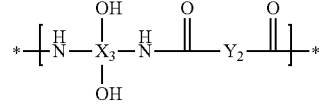

[Chemical Formula 3]

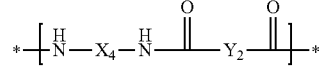

wherein, in the above Chemical Formula, $X_3$ is an aromatic organic group or a tetravalent to hexavalent aliphatic organic group, $X_4$ is an aromatic organic group, a divalent to hexavalent aliphatic organic group, or a divalent to hexavalent alicyclic organic group, and $Y_2$ are the same or different and are each independently an aromatic organic group or a divalent to hexavalent aliphatic organic group.

In another embodiment, the polybenzoxazole precursor may include a repeating unit represented by the above Chemical Formula 1 and a repeating unit represented by the above Chemical Formula 2 and/or a repeating unit represented by the above Chemical Formula 3 at a mole ratio of m:n (wherein m+n=100 mol %, m ranges from about 5 to about 100 mol %, and n ranges from about 0 to about 95 mol %. In another embodiment of the present invention, m ranges from about 5 to about 75 mol %, and n ranges from about 25 to about 95 mol %.

In some embodiments, the polybenzoxazole precursor may include a repeating unit represented by the above Chemical Formula 1 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 58, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 mol %. Further, according to some embodiments of the present invention, the amount of the repeating unit represented by the above Chemical Formula 1 can be in a range from about any of the foregoing amounts to about any other of the foregoing amounts.

In some embodiments, the polybenzoxazole precursor may include a repeating unit represented by the above Chemical Formula 2 and/or a repeating unit represented by the above Chemical Formula 3 in an amount of about 0 (which can be 0 mol % or an amount greater than 0 mol %), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 58, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 mol %. Further, according to some embodiments of the present invention, the amount of the repeating unit represented by the above Chemical Formula 2 and/or a repeating unit represented by the above Chemical Formula 3 can be in a range from about any of the foregoing amounts to about any other of the foregoing amounts.

Within the above ranges of m and n, a balance of properties required for a photosensitive resin film of a semiconductor device may be obtained. Examples of $X_1$, $X_2$, and $X_3$ include without limitation a residual group derived from a compound such as 3,3'-diamino-4,4'-dihydroxybiphenyl, 4,4'-diamino- 3,3'-dihydroxybiphenyl, bis(3-amino-4-hydroxyphenyl)propane, bis(4-amino-3-hydroxyphenyl)propane, bis(3-amino-4-hydroxyphenyl) sulfone, bis (4-amino-3-hydroxyphenyl) sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2'-bis(3-amino-4-hydroxy-5-trifluoromethylphenyl) hexafluoropropane, 2,2'-bis(3-amino-4-hydroxy-6-trifluoromethylphenyl) hexafluoropropane, 2,2'-bis(3-amino-4-hydroxy-2-trifluoromethylphenyl) hexafluoropropane, 2,2'-bis(4-amino-3-hydroxy-5-trifluoromethylphenyl) hexafluoropropane, 2,2'-bis (4-amino-3-hydroxy-6-trifluoromethylphenyl) hexafluoropropane, 2,2'-bis(4-amino-3-hydroxy-2-trifluoromethylphenyl) hexafluoropropane, 2,2'-bis(3-amino-4-hydroxy-5-pentafluoroethylphenyl) hexafluoropropane, 2-(3-amino-4-hydroxy-5-trifluoromethylphenyl)-2'-(3-amino-4-hydroxy-5-pentafluoroethylphenyl) hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl) hexafluoropropane, 2-(3-amino-4-hydroxy-5-trifluoromethylphenyl)-2'-(3-hydroxy-4-amino-2-trifluoromethylphenyl) hexafluoropropane, 2-(3-amino-4-hydroxy-2-trifluoromethylphenyl)-2'-(3-hydroxy-4-amino-5-trifluoromethylphenyl) hexafluoropropane, 2-(3-amino-4-hydroxy-6-trifluoromethylphenyl)-2'-(3-hydroxy-4-amino-5-trifluoromethylphenyl) hexafluoropropane, 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, the like, and combinations thereof.

Each $X_1$, $X_2$ and $X_3$ may independently be a group represented by the following Chemical Formula 5, Chemical Formula 6, or a combination thereof.

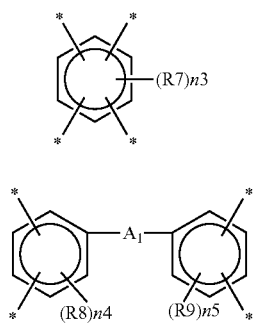

[Chemical Formula 5]

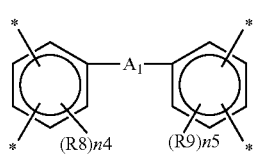

[Chemical Formula 6]

In Chemical Formulas 5 and 6, $A_1$ is O, CO, $CR_{10}R_{11}$, $SO_2$, SO, or a single bond, wherein $R_{10}$ and $R_{11}$ are the same or different and are each independently hydrogen or substituted or unsubstituted alkyl, for example each $R_{10}$ and $R_{11}$ may be fluoroalkyl, $R_7$ to $R_9$ are the same or different and are each independently hydrogen or substituted or unsubstituted alkyl, $n_3$ is an integer of 1 to 2, and $n_4$ and $n_5$ are the same or different and are each independently integers of 1 to 3.

$X_4$ may be derived from aromatic diamine. Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis (4-aminophenoxyphenyl)sulfone, bis(3-aminophenoxyphenyl)sulfone, bis (4-aminophenoxy)biphenyl, bis[4-(4-aminophenoxy)phenyl]ether, 1,4-bis (4-aminophenoxy)benzene, and the like, and combinations thereof. The aromatic diamine monomer may be used singularly or as a mixture thereof. The aromatic diamine is not limited to the above compounds.

Examples of $Y_1$ and $Y_2$ may include a residual group derived from a dicarboxylic acid or a residual group derived from a dicarboxylic acid derivative.

The dicarboxylic acid may be $Y(COOH)_2$ (wherein Y is the same as $Y_1$ and $Y_2$ of Chemical Formula 1). Examples of the carboxylic acid derivative may include without limitation carbonyl halide derivatives, active compounds of an active ester derivative obtained by reacting $Y(COOH)_2$ and 1-hydroxy-1,2,3-benzotriazole, and the like, and combinations thereof.

Examples of the dicarboxylic acid derivative include without limitation 4,4'-oxydibenzoyl chloride, diphenyloxydicarbonylchloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxy dicarboxylatedibenzotriazole, and the like, and combinations thereof.

$Y_1$ and $Y_2$ may include a functional group represented by one of the following Chemical Formulae 7 to 9, or a combination thereof, but are not limited thereto.

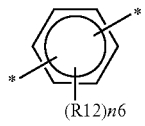

[Chemical Formula 7]

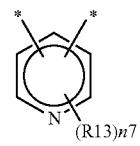

[Chemical Formula 8]

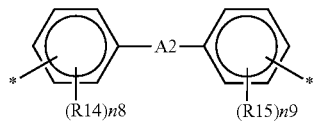

[Chemical Formula 9]

In Chemical Formulas 7 to 9, $R_{12}$ to $R_{15}$ are the same or different and are each independently hydrogen or substituted or unsubstituted alkyl, $n_6$, $n_8$ and $n_9$ are the same or different and are each independently integers ranging from 1 to 4, $n_7$ is an integer ranging from 1 to 3, $A_2$ is O, $CR_{16}R_{17}$, CO, CONH, S, or $SO_2$, wherein $R_{16}$ and $R_{17}$ are the same or different and are each independently substituted or unsubstituted alkyl, hydrogen, or fluoroalkyl.

Further, the polybenzoxazole precursor may include a thermally polymerizable functional group derived from a reactive end-capping monomer at at least one terminal end of branched chain of the polybenzoxazole precursor. Examples of the reactive end-capping monomer may include without limitation monoamines, monoanhydrides including carbon-carbon double bonds, and the like, and combinations thereof.

Examples of the monoamines include without limitation toluidine, dimethylaniline, ethylaniline, aminophenol, aminobenzylalcohol, aminoindan, aminoacetonephenone, and the like and combinations thereof.

Examples of the monoanhydrides include without limitation 5-norbornene-2,3-dicarboxylanhydride represented by the following Chemical Formula 10, 3,6-epoxy-1,2,3,6-tetrahydrophthalic anhydride represented by the following Chemical Formula 11, isobutenyl succinic anhydride represented by the following Chemical Formula 12, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

[Chemical Formula 10]

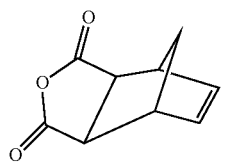

[Chemical Formula 11]

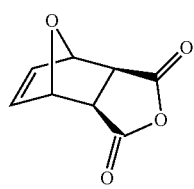

[Chemical Formula 12]

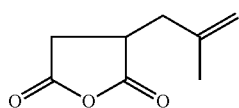

The following Chemical Formulas 13 to 17 are non-limiting examples of the thermally polymerizable functional group that is positioned at the terminal end of the polybenzoxazole precursor, and the thermally polymerizable functional group may be cross-linked during heating of the polybenzoxazole precursor preparation process.

[Chemical Formula 13]

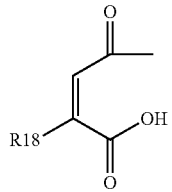

In Chemical Formula 13, $R_{18}$ is H, $CH_2COOH$, or $CH_2CHCHCH_3$.

[Chemical Formula 14]

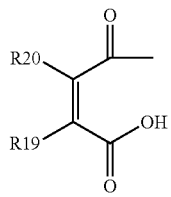

In Chemical Formula 14, $R_{19}$ and $R_{20}$ are the same or different and are each independently H or $CH_3$.

[Chemical Formula 15]

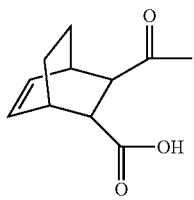

[Chemical Formula 16]

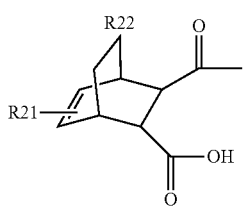

In Chemical Formula 16, $R_{21}$ is H or $CH_3$, and $R_{22}$ is $CH_2$ or O.

[Chemical Formula 17]

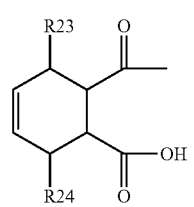

In Chemical Formula 17, $R_{23}$ and $R_{24}$ are the same or different and each independently H, $CH_3$ or $OCOCH_3$.

The polybenzoxazole precursor can have a weight average molecular weight (Mw) ranging from about 3,000 to about 300,000. When the polybenzoxazole precursor has a weight average molecular weight within the above range, sufficient physical properties and excellent solubility to the organic solvent may be provided.

(B) Photosensitive Diazoquinone Compound

The photosensitive diazoquinone compound may be a compound including a 1,2-benzoquinone diazide or 1,2-naphtoquinone diazide structure. The photosensitive diazoquinone compound may include a compound represented by one of the following Chemical Formulas 18 to 21, or a combination thereof.

[Chemical Formula 18]

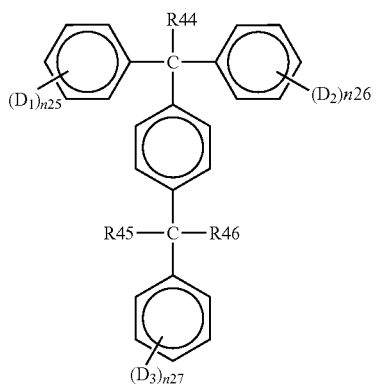

In Chemical Formula 18, $R_{44}$ to $R_{46}$ are the same or different and are each independently substituted or unsubstituted alkyl, for example $CH_3$, $D_1$ to $D_3$ are the same or different and are each independently OQ, Q is hydrogen, the following Chemical Formula 18-1 or 18-2 provided that all Qs are not simultaneously hydrogen, and $n_{25}$ to $n_{27}$ are the same or different and are each independently integers ranging from 1 to 3.

[Chemical Formula 18-1]

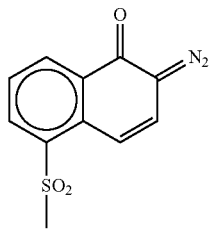

[Chemical Formula 18-2]

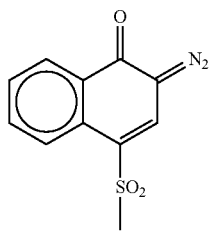

[Chemical Formula 19]

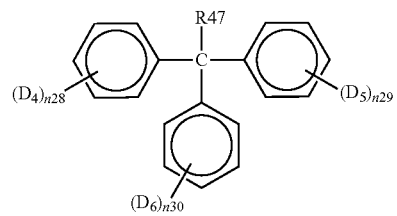

In Chemical Formula 19, $R_{47}$ is hydrogen or substituted or unsubstituted alkyl, $D_4$ to $D_6$ are the same or different and are each independently OQ, wherein Q is the same as defined in Chemical Formula 18, and $n_{28}$ to $n_{30}$ are the same or different and are each independently integers ranging from 1 to 3.

[Chemical Formula 20]

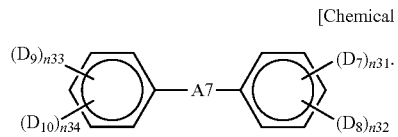

In Chemical Formula 20, $A_7$ is CO or $CR_{48}R_{49}$, wherein $R_{48}$ and $R_{49}$ are the same or different and are each independently substituted or unsubstituted alkyl, $D_7$ to $D_{10}$ are the same or different and are each independently hydrogen, substituted or unsubstituted alkyl, OQ, or NHQ, wherein Q is the same as defined in Chemical Formula 18, $n_{31}$, $n_{32}$, $n_{33}$ and $n_{34}$ are the same or different and are each independently integers ranging from 1 to 4, and $n_{31}+n_{32}$ and $n_{33}+n_{34}$ are the same or different and are each independently integers of 5 or less, provided that at least one of $D_7$ to $D_8$ is OQ, and one aromatic ring includes one to three OQs and the other aromatic ring includes one to four OQs.

[Chemical Formula 21]

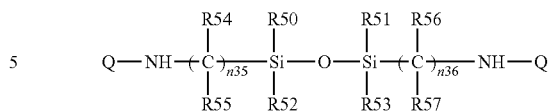

In Chemical Formula 21, $R_{50}$ to $R_{57}$ are the same or different and are each independently hydrogen or substituted or unsubstituted alkyl, $n_{35}$ and $n_{35}$ are the same or different and are each independently integers ranging from 1 to 5, for example 2 to 4, and each Q is the same or different and is the same as defined in Chemical Formula 18.

The positive photosensitive resin composition can include the photosensitive diazoquinone compound in an amount of about 5 to about 100 parts by weight based on about 100 parts by weight of the polybenzoxazole precursor. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the amount of the photosensitive diazoquinone compound is within the above range, the pattern can be well-formed without a residue from exposure, and film thickness loss during development can be minimized or prevented and thereby a good pattern can be provided.

(C) Silane Compound

The silane compound can improve adherence between the photosensitive resin composition and a substrate. The silane compound may be represented by the following Chemical Formula 22.

[Chemical Formula 22]

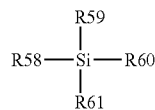

In Chemical Formula 22, $R_{58}$ is a vinyl group, substituted or unsubstituted alkyl, or substituted or unsubstituted aryl, for example -(meth)acryloxypropyl, p-styryl, or 3-(phenylamino)propyl;

$R_{59}$ to $R_{61}$ are the same or different and are each independently substituted or unsubstituted alkoxy, substituted or unsubstituted alkyl, or halogen, provided that at least one of $R_{59}$ to $R_{61}$ is alkoxy or halogen.

The alkoxy may be C1 to C8 alkoxy, and the alkyl may be C1 to C20 alkyl.

Examples of the silane compound include without limitation a compound represented by the following Chemical Formulas 23 and 24, and combinations thereof; silane compounds including a carbon-carbon unsaturated bond such as vinyltrimethoxysilane, vinyltriethoxysilane, vinyl trichlorosilane, vinyltris(β-methoxyethoxy)silane; 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyldi ethoxysilane; trimethoxy[3-(phenylamino)propyl]silane, and the like, and combinations thereof.

[Chemical Formula 23]

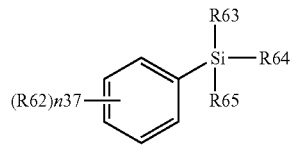

In Chemical Formula 23, $R_{62}$ is $NH_2$ or $CH_3CONH$, $R_{63}$ to $R_{65}$ are the same or different are are each independently substituted or unsubstituted alkoxy, for example, the alkoxy may be $OCH_3$ or $OCH_2CH_3$, and $n_{37}$ is an integer of 1 to 5.

[Chemical Formula 24]

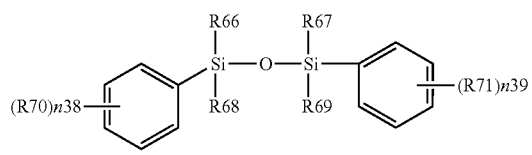

In Chemical Formula 24, $R_{66}$ to $R_{69}$ are the same or different and are each independently substituted or unsubstituted alkyl or substituted or unsubstituted alkoxy, for example $CH_3$ or $OCH_3$, $R_{70}$ and $R_{71}$ are the same or different and are each independently substituted or unsubstituted amino, for example $NH_2$ or $CH_3CONH$, and $n_{38}$ and $n_{39}$ are the same or different and are each independently integers ranging from 1 to 5.

The positive photosensitive resin composition may include the silane compound in an amount of about 0.1 to about 30 parts by weight based on about 100 parts by weight of the polybenzoxazole precursor. In some embodiments, the positive photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or parts by weight. Further, according to some embodiments of the present invention, the amount of the silane compound can be in a range from about any of the foregoing amounts to about any other of the foregoing amounts.

When the silane compound is included in an amount within the above range, adherence between lower and upper layers can be improved, residual film may not remain after development, and optical properties (transmittance) may be improved.

(D) Phenol Compound

The phenol compound can increase dissolution and sensitivity of exposed parts during development using an alkali aqueous solution for patterning, and can play a role of forming high resolution patterns without residues (scum).

The phenol compound may be a compound represented by one of the following Chemical Formulas 25 to 30, or a combination thereof, but is not limited thereto.

[Chemical Formula 25]

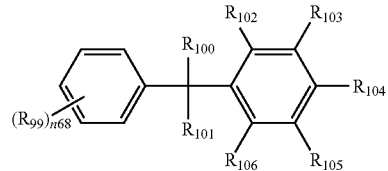

In Chemical Formula 25, $R_{99}$ to $R_{101}$ are the same or different are each independently hydrogen or substituted or unsubstituted alkyl, $R_{102}$ to $R_{106}$ are the same or different are each independently H, OH, or substituted or unsubstituted alkyl, for example the alkyl may be $CH_3$, and $n_{60}$ is an integer ranging from 1 to 5.

[Chemical Formula 26]

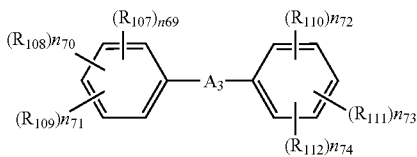

In Chemical Formula 26, $R_{107}$ to $R_{112}$ are the same or different and are each independently H, OH, or substituted or unsubstituted alkyl, $A_3$ is $CR_{205}R_{206}$ or a single bond, wherein $R_{205}$ and $R_{206}$ are the same or different and are each independently hydrogen or substituted or unsubstituted alkyl, for example $CH_3$, $n_{69}+n_{70}+n_{71}$ and $n_{72}+n_{73}+n_{74}$ are the same or different and are each independently integers of 5 or less.

[Chemical Formula 27]

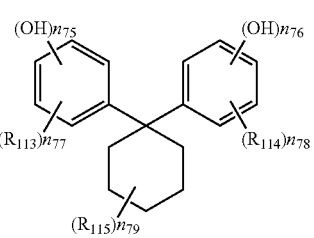

In Chemical Formula 27, $R_{113}$ to $R_{115}$ are the same or different and are each independently hydrogen or substituted or unsubstituted alkyl, $n_{75}$, $n_{76}$ and $n_{79}$ are the same or different and are each independently integers ranging from 1 to 5, and $n_{77}$ and $n_{78}$ are the same or different and are each independently integers ranging from 0 to 4.

[Chemical Formula 28]

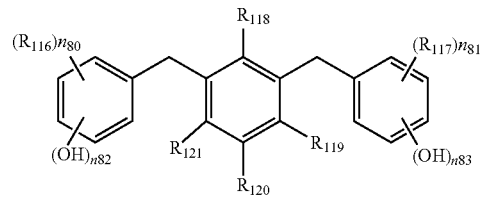

In Chemical Formula 28, $R_{116}$ to $R_{121}$ are the same or different and are each independently hydrogen, OH, or substituted or unsubstituted alkyl, $n_{80}$ to $n_{83}$ are the same or different and are each independently integers ranging from 1 to 4, and $n_{80}+n_{82}$ and $n_{81}+n_{83}$ are the same or different and are independently integers of 5 or less.

[Chemical Formula 29]

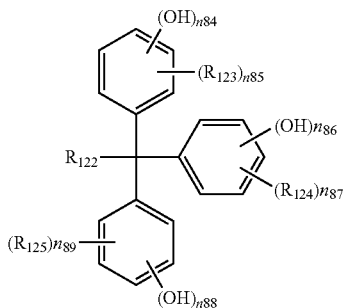

In Chemical Formula 29, $R_{122}$ is substituted or unsubstituted alkyl, for example $CH_3$, $R_{123}$ to $R_{125}$ are the same or different and are each independently hydrogen or substituted or unsubstituted alkyl, $n_{84}$, $n_{86}$ and $n_{88}$ are the same or different and are each independently integer ranging from 1 to 5, $n_{85}$, $n_{87}$ and $n_{89}$ are the same or different and are each independently integers ranging from 0 to 4, $n_{84}+n_{86}$, $n_{86}+n_{87}$ and $n_{88}+n_{89}$ are the same or different and are independently integers of 5 or less.

[Chemical Formula 30]

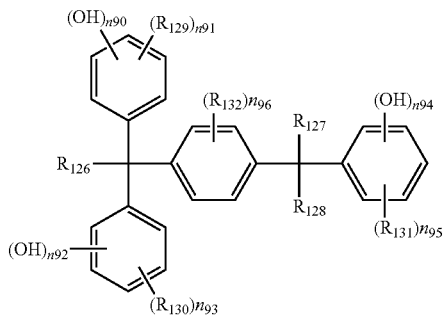

In Chemical Formula 30, $R_{126}$ to $R_{128}$ are the same or different and are independently substituted or unsubstituted alkyl, for example $CH_3$, $R_{129}$ to $R_{132}$ are the same or different and are each independently hydrogen or substituted or unsubstituted alkyl, $n_{90}$, $n_{92}$ and $n_{94}$ are the same or different and are each independently integers ranging from 1 to 5, $n_{91}$, $n_{93}$ and $n_{95}$ are the same or different and are each independently integers ranging from 0 to 4, $n_{96}$ is an integer ranging from 1 to 4, and $n_{90}+n_{91}$, $n_{92}+n_{93}$ and $n_{94}+n_{95}$ are the same or different and are independently integers of 5 or less.

Examples of the phenol compound may include without limitation 2,6-dimethoxymethyl-4-t-butylphenol, 2,6-dimethoxymethyl-p-cresol, 2,6-diacetoxymethyl-p-cresol, and the like, and combinations thereof.

The positive photosensitive resin composition may include the phenol compound in an amount of about 1 to about 30 parts by weight based on about 100 parts by weight of the polybenzoxazole precursor. In some embodiments, the positive photosensitive resin composition may include the phenol compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the phenol compound can be in a range from about any of the foregoing amounts to about any other of the foregoing amounts.

When the phenol compound is included in an amount within the above range, sensitivity during development may be improved, and the dissolubility of the non-exposed part may be suitably increased to provide a good pattern. In addition, precipitation during freezing may not not occur, so excellent storage stability may be realized.

(E) Solvent

The solvent may be an organic solvent. Examples of the solvent may include without limitation N-methyl-2-pyrrolidone, γ-butyrolactone, N,N-dimethyl acetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethylpyruvate, methyl-3-methoxy propionate, and the like, and combinations thereof. The solvent may be used singularly or as a mixture of two or more.

The positive photosensitive resin composition may include the solvent in an amount of about 100 to about 400 parts by weight, for example about 20 to about 90 parts by weight, based on about 100 parts by weight of the polybenzoxazole precursor. When the solvent is used in an amount within the above range, a sufficiently thick film can be obtained, and good solubility and coating can be provided.

(F) Other Additive(s)

The positive photosensitive resin composition according to the present invention may further include one or more (F) other additives as well as (A) to (E) components.

An example of the other additives includes a latent thermal acid generator. Examples of the latent thermal acid generator include without limitation arylsulfonic acids such as p-toluenesulfonic acid and benzenesulfonic acid; perfluoroalkylsulfonic acids such as trifluoromethanesulfonic acid and trifluorobutanesulfonic acid; alkylsulfonic acids such as methanesulfonic acid, ethanesulfonic acid, and butanesulfonic acid; and the like, and combinations thereof.

The latent thermal acid generator is a catalyst for a cyclization reaction of the polybenzoxazole precursor, and thus a cyclization reaction can be performed smoothly even if curing temperature is decreased.

In addition, the positive photosensitive resin composition may further include an additive such as a suitable surfactant or leveling agent to prevent staining of the film or to improve development.

The process for forming a pattern using a positive photosensitive resin composition includes: coating a positive photosensitive resin composition on a supporting substrate; drying the coated positive photosensitive resin composition to provide a photosensitive polybenzoxazole precursor layer; exposing the polybenzoxazole precursor layer; developing the polybenzoxazole precursor layer using an alkali aqueous solution to provide a photosensitive resin film; and heating the photosensitive resin film. The conditions of processes to provide a pattern are widely known in this art, so detailed descriptions thereof will be omitted in this specification.

According to another embodiment, a photosensitive resin film fabricated using the positive photosensitive resin composition is provided. The positive photosensitive resin composition may be useful for forming an insulation layer, a passivation layer, or a buffer coating layer of a semiconductor device. That is to say, the positive photosensitive resin composition may be useful for forming a surface protective layer and an interlayer insulating layer of a semiconductor device.

[Chemical Formula 4]

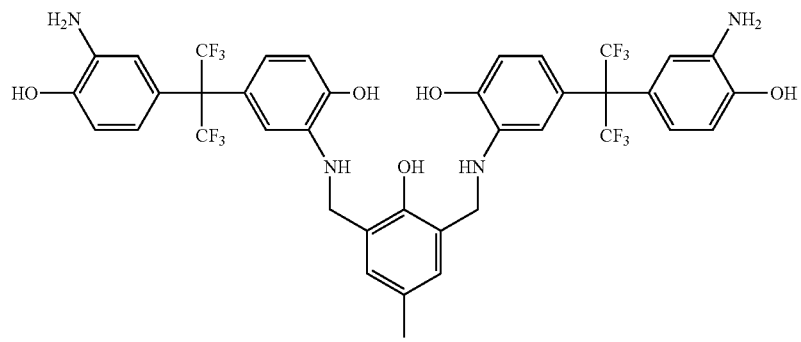

[Chemical Formula 1a]

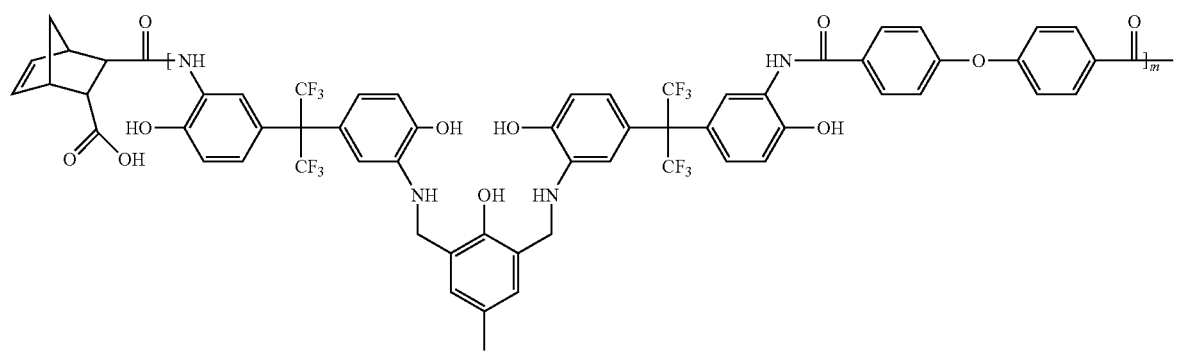

The following examples illustrate the present invention in more detail. However, it is understood that the present invention is not limited by these examples.

EXAMPLE

Synthesis Example 1

Synthesis of Polybenzoxazole Precursor P(BO-1)

In a four-necked flask mounted with an agitator, a temperature controlling device, a nitrogen gas injector, and a condenser, 41.1 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol (compound represented by the following Chemical Formula 4) is added and dissolved into 280 g of N-methyl-2-pyrrolidone (NMP) while nitrogen is passed therethrough. When the solid is completely dissolved, 9.9 g of pyridine is introduced into the solution and slowly dripped with a solution in which 13.3 g of 4,4'-oxydibenzoylchloride is dissolved into 142 g of N-methyl-2-pyrrolidone (NMP) for 30 minutes while maintaining the temperature at 0 to 5° C. After the dripping, it is reacted at 0 to 5° C. for one hour and agitated for one hour after increasing the temperature to room temperature to complete the reaction. 1.6 g of 5-norbornene-2,3-dicarboxylanhydride is added thereto and agitated at 70° C. for 24 hours to complete the reaction. The reaction mixture is added to a solution of water/methanol=10/1 (volume ratio) to provide a precipitate. The precipitate is filtered and sufficiently washed with water and dried at a temperature of 80° C. under the vacuum for 24 hours or longer to provide a polybenzoxazole precursor (PBO-1) represented by the following Chemical Formula 1a (m and n refer to a mole ratio, m=100, n=0) having a weight average molecular weight of 9,500.

Synthesis Example 2

Synthesis of Polybenzoxazole Precursor (PBO-2)

In a four-necked flask mounted with an agitator, a temperature controlling device, a nitrogen gas injector, and a condenser, 30.8 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, and 4.4 g of 2,2-bis(3-amino-4-hydroxyphenyl)-1,1,1,3,3,3-hexafluoropropane are added and dissolved into 280 g of N-methyl-2-pyrrolidone (NMP) while nitrogen is passed therethrough. When the solid is completely dissolved, 9.9 g of pyridine is added into the solution and slowly dripped with a solution in which 13.3 g of 4,4'-oxydibenzoylchloride is dissolved into 142 g of N-methyl-2-pyrrolidone (NMP) for 30 minutes while maintaining the temperature at 0 to 5° C. After the drip, it is reacted at 0 to 5° C. for one hour and agitated for one hour after increasing the temperature to room temperature to complete the reaction. 1.6 g of 5-norbornene-2,3-dicarboxylanhydride is added thereto and agitated at 70° C. for 24 hours to complete the reaction. The reaction mixture is added to a solution of water/methanol=10/1 (volume ratio) to provide a precipitate. The precipitate is filtered and sufficiently washed with water and dried at a temperature of 80° C. under the vacuum for 24 hours or longer to provide a polybenzoxazole precursor (PBO-2) represented by the following Chemical Formula 1b (m and n refer to a mole ratio, m=75, n=25) having a weight average molecular weight of 10,100.

[Chemical Formula 1b]

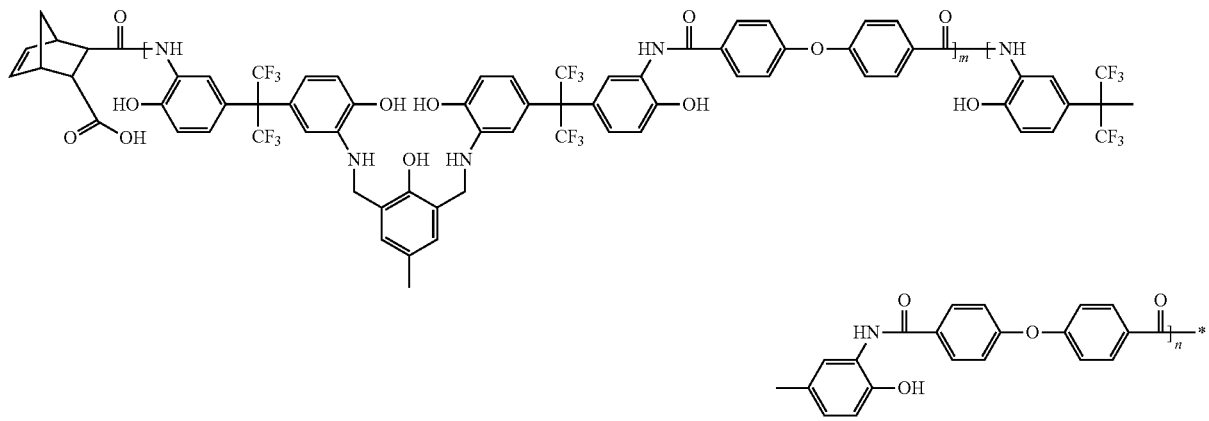

Synthesis Example 3

Synthesis of Polybenzoxazole Precursor (PBO-3)

In a four-necked flask mounted with an agitator, a temperature controlling device, a nitrogen gas injector, and a condenser, 24.2 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, and 10.3 g of 2,2-bis(3-amino-4-hydroxyphenyl)-1,1,1,3,3,3-hexafluoropropane are added and dissolved in 280 g of N-methyl-2-pyrrolidone (NMP) while nitrogen is passed therethrough. When the solid is completely dissolved, 9.9 g of pyridine is added into the solution and slowly dripped with a solution in which 13.3 g of 4,4'-oxydibenzoylchloride is dissolved into 142 g of N-methyl-2-pyrrolidone (NMP) for 30 minutes while maintaining the temperature at 0 to 5° C. After the drip, it is reacted at 0 to 5° C. for one hour and agitated for one hour after increasing the temperature to room temperature to complete the reaction. 1.6 g of 5-norbornene-2,3-dicarboxylanhydride is added thereto and agitated at 70° C. for 24 hours to complete the reaction. The reaction mixture is added to a solution of water/methanol=10/1 (volume ratio) to provide a precipitate. The precipitate is filtered and sufficiently washed with water and dried at a temperature of 80° C. under the vacuum for 24 hours or longer to provide a polybenzoxazole precursor (PBO-3) represented by the following Chemical Formula 1c (m and n refer to a mole ratio, m=50, n=50) having a weight average molecular weight of 10,300.

[Chemical Formula 1c]

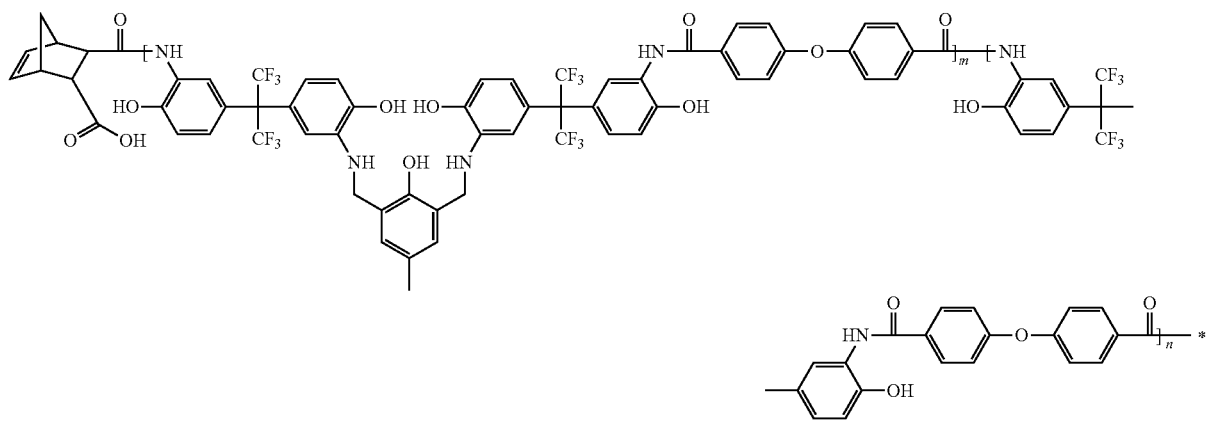

Synthesis Example 4

Synthesis of Polybenzoxazole Precursor (PBO-4)

In a four-necked flask mounted with an agitator, a temperature controlling device, a nitrogen gas injector, and a condenser, 10.3 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, and 13.1 g of 2,2-bis(3-amino-4-hydroxyphenyl)-1,1,1,3,3,3-hexafluoropropane are added and dissolved into 280 g of N-methyl-2-pyrrolidone (NMP) while nitrogen is passed therethrough. When the solid is completely dissolved, 9.9 g of pyridine is added into the solution and slowly dripped with a solution in which 13.3 g of 4,4'-oxydibenzoylchloride is dissolved into 142 g of N-methyl-2-pyrrolidone (NMP) for 30 minutes while maintaining the temperature at 0 to 5° C. After the drip, it is reacted at 0 to 5° C. for one hour and agitated for one hour after increasing the temperature to room temperature to complete the reaction. 1.6 g of 5-norbornene-2,3-dicarboxylanhydride is added thereto and agitated at 70° C. for 24 hours to complete the reaction. The reaction mixture is added to a solution of water/methanol=10/1 (volume ratio) to provide a precipitate. The precipitate is filtered and sufficiently washed with water and dried at a temperature of 80° C. under the vacuum for 24 hours or longer to provide a polybenzoxazole precursor (PBO-4) represented by the following Chemical Formula 1d (m and n refer to a mole ratio, m=25, n=75) having a weight average molecular weight of 10,300.

(3-amino-4-hydroxyphenyl)-1,1,1,3,3,3-hexafluoropropane are added and dissolved into 280 g of N-methyl-2-pyrrolidone (NMP) while nitrogen is passed therethrough. When the solid is completely dissolved, 9.9 g of pyridine is added into the solution and slowly dripped with a solution in which 13.3 g of 4,4'-oxydibenzoylchloride is dissolved into 142 g of N-methyl-2-pyrrolidone (NMP) for 30 minutes while maintaining the temperature at 0 to 5° C. After the drip, it is reacted at 0 to 5° C. for one hour and agitated for one hour after increasing the temperature to room temperature to complete the reaction. 1.6 g of 5-norbornene-2,3-dicarboxylanhydride is added thereto and agitated at 70° C. for 24 hours to com-

[Chemical Formula 1d]

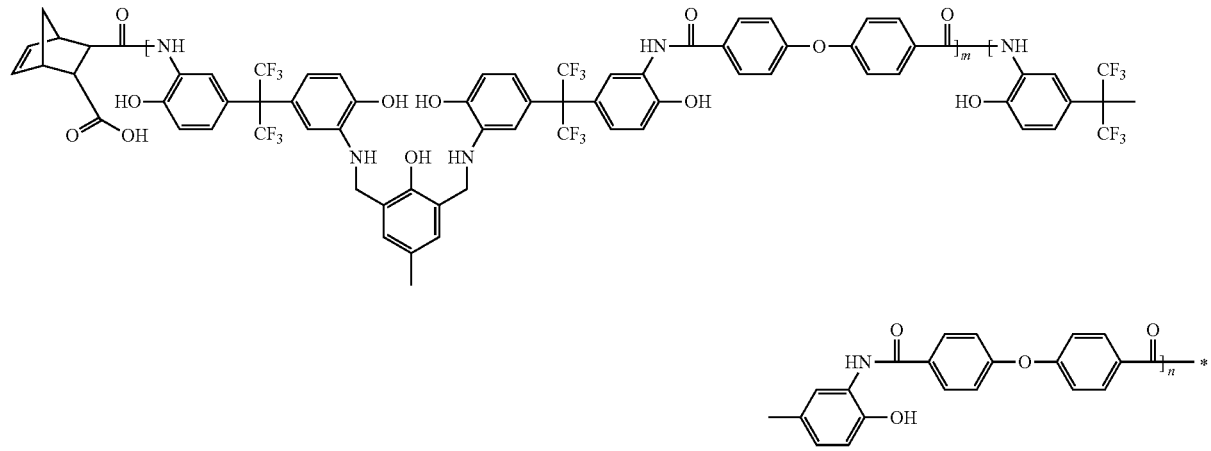

Synthesis Example 5

Synthesis of Polybenzoxazole Precursor (PBO-5)

In a four-necked flask mounted with an agitator, a temperature controlling device, a nitrogen gas injector, and a condenser, 2.1 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol, and 16.9 g of 2,2-bis plete the reaction. The reaction mixture is added to a solution of water/methanol=10/1 (volume ratio) to provide a precipitate. The precipitate is filtered and sufficiently washed with water and dried at a temperature of 80° C. under the vacuum for 24 hours or longer to provide a polybenzoxazole precursor (PBO-5) represented by the following Chemical Formula 1e (m and n refer to a mole ratio, m=5, n=95) having a weight average molecular weight of 10,200.

[Chemical Formula 1e]

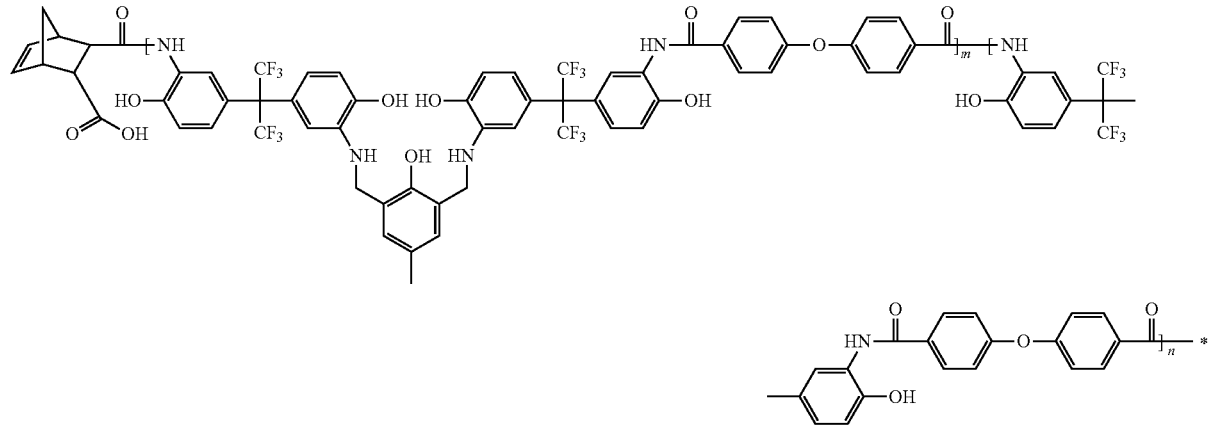

Synthesis Example 6
Synthesis of Polybenzoxazole Precursor (PBO-6)
Comparative Example In a four-necked flask mounted with an agitator, a temperature controlling device, a nitrogen gas injector, and a condenser, 17.4 g of 2,2-bis (3-amino-4-hydroxyphenyl)-1,1,1,3,3,3-hexafluoropropane is added and dissolved in 280 g of N-methyl-2-pyrrolidone (NMP) while nitrogen is passed therethrough. When the solid is completely dissolved, 9.9 g of pyridine is added into the solution and slowly dripped with a solution in which 13.3 g of 4,4'-oxydibenzoylchloride is dissolved into 142 g of N-methyl-2-pyrrolidone (NMP) for 30 minutes while maintaining the temperature at 0 to 5° C. After the drip, it is reacted at 0 to 5° C. for one hour and agitated for one hour after increasing the temperature to room temperature to complete the reaction. 1.6 g of 5-norbornene-2,3-dicarboxylanhydride is added thereto and agitated at 70° C. for 24 hours to complete the reaction. The reaction mixture is added to a solution of water/methanol=10/1 (volume ratio) to provide a precipitate. The precipitate is filtered and sufficiently washed with water and dried at a temperature of 80° C. under the vacuum for 24 hours or longer to provide a polybenzoxazole precursor (PBO-6) represented by the following Chemical Formula If (m and n refer to a mole ratio, m=0, n=100) having a weight average molecular weight of 10,500.

[Chemical Formula 1f]

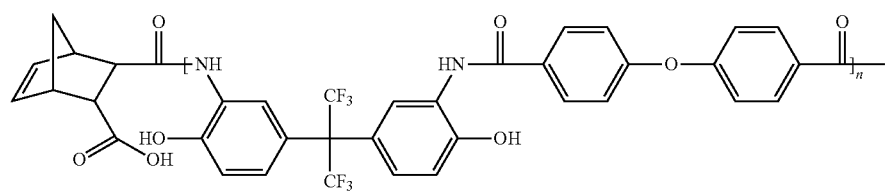

Example 1

10 g of polybenzoxazole precursor (PBO-1) obtained from Synthesis Example 1 is added and dissolved into 35.0 g of γ-butyrolactone (GBL) and added and dissolved with 1 g of a photosensitive diazoquinone having a structure of the following Chemical Formula 15a, 0.02 g of trimethoxy[3-(phenylamino)propyl]silane represented by the following Chemical Formula 20a, and 0.75 g of a phenol compound represented by the following Chemical Formula 22a and then filtered by a 0.45 μm fluoro resin filter to provide a positive photosensitive resin composition.

[Chemical Formula 15a]

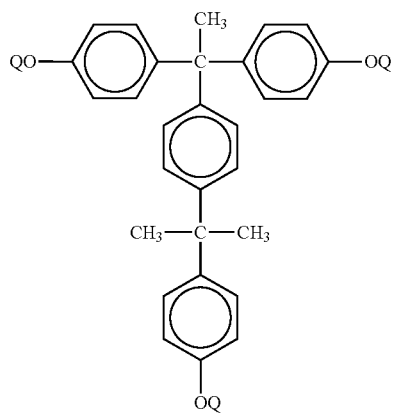

In Chemical Formula 15a, at least two of $Q_1$, $Q_2$ and $Q_3$ are

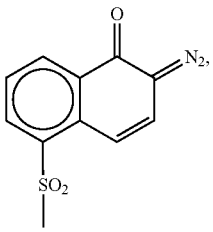

and the remaining one is hydrogen.

[Chemical Formula 20a]

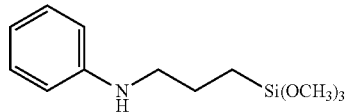

[Chemical Formula 22a]

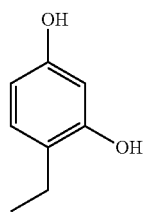

Example 2

A positive photosensitive resin composition is prepared in accordance with the same procedure as in Example 1, except that 10 g of polybenzoxazole precursor (PBO-1) is substituted with polybenzoxazole precursor (PBO-2).

Example 3

A positive photosensitive resin composition is prepared in accordance with the same procedure as in Example 1, except that 10 g of polybenzoxazole precursor (PBO-1) is substituted with polybenzoxazole precursor (PBO-3).

Example 4

A positive photosensitive resin composition is prepared in accordance with the same procedure as in Example 1, except that 10 g of polybenzoxazole precursor (PBO-1) is substituted with polybenzoxazole precursor (PBO-4).

Example 5

A positive photosensitive resin composition is prepared in accordance with the same procedure as in Example 1, except that 10 g of polybenzoxazole precursor (PBO-1) is substituted with polybenzoxazole precursor (PBO-5).

Example 6

A positive photosensitive resin composition is prepared in accordance with the same procedure as in Example 1, except that 10 g of polybenzoxazole precursor (PBO-1) is substituted with 5 g of polybenzoxazole precursor (PBO-1) and 5 g of polybenzoxazole precursor (PBO-6).

Comparative Example 1

A positive photosensitive resin composition is prepared in accordance with the same procedure as in Example 1, except that 10 g of polybenzoxazole precursor (PBO-1) is substituted with polybenzoxazole precursor (PBO-6).

Measurement of Physical Properties

Each positive photosensitive resin composition prepared from Examples 1 to 6 and Comparative Example 1 is coated on a 8-inch wafer by a spin coater manufactured by Mikasa (1H-DX$_2$), then heated on a hot plate to 130° C. for 2 minutes to provide a photosensitive polyimide precursor film. The polyimide precursor films are exposed through a mask having various patterns by an I-line stepper (NSR i10C) manufactured by Japan Nikon for 250 ms, dissolved in a 2.38% tetramethyl ammonium hydroxide aqueous solution at room temperature for 40 seconds (2 puddles) to remove the exposed part, and washed with pure water for 30 seconds. In addition, the obtained pattern is cured in an electric furnace under an oxygen concentration of 1000 ppm or below at 150° C. for 30 minutes and additionally at 320° C. for 30 minutes to provide a patterned film. The resolution of the obtained film pattern is measured by an optical microscope, and the film thickness variation after the pre-baking, developing, and curing processes is measured by equipment manufactured by KMAC (ST4000-DLX). The results are shown in the following Table 1.

In addition, because layer thickness loss after development affects the development and the final layer thickness, it is desirable to decrease layer thickness loss during development. In order to measure the same, the prebaked film is dipped in 2.38% tetramethylammonium hydroxide (TMAH) aqueous solution at different times and washed with water, and the film thickness variation during development is measured. The results are shown in the following Table 1.

The sensitivity and resolution are measured, and the results are shown in the following Table 1. The sensitivity is determined by measuring the exposing time that a 10 um L/S pattern is obtained as 1:1 line width after the exposure and the development. The resolution is determined by measuring a minimum pattern size in the optical exposing time.

TABLE 1

| | Film thickness (μm) | | Sensitivity (mJ/cm$^2$) | Resolution (μm) | film thickness variation during development (μm) |
|---|---|---|---|---|---|
| | Pre-baking | After development | | | |
| Example 1 | 9.6 | 8.4 | 420 | 2 | 1.2 |
| Example 2 | 9.3 | 8.1 | 400 | 3 | 1.2 |
| Example 3 | 8.8 | 7.7 | 360 | 4 | 1.1 |
| Example 4 | 9.4 | 8.3 | 340 | 5 | 1.1 |
| Example 5 | 9.0 | 7.8 | 350 | 4 | 1.2 |
| Example 6 | 8.8 | 7.6 | 400 | 3 | 1.2 |
| Comparative Example 1 | 8.6 | 6.5 | 450 | 7 | 2.1 |

Referring to Table 1, Examples 1 to 6 including PBO precursors including 2,6-bis[[[5-[1-(amino-4-hydroxyphenyl)-2,2,2-trifluoro-1-(trifluoromethyl)ethyl]-2-hydroxyphenyl]amino]methyl]-4-methylphenol monomer exhibit significantly improved sensitivity, reduced thickness loss after the curing process, and enhanced optical properties such as resolution, shrinkage, film thickness loss during the development and the like, as compared to Comparative Example 1.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A positive photosensitive resin composition, comprising:
    (A) a polybenzoxazole precursor including a repeating unit represented by the following Chemical Formula 1;
    (B) a photosensitive diazoquinone compound;
    (C) a silane compound;
    (D) a phenol compound; and
    (E) a solvent:

[Chemical Formula 1]

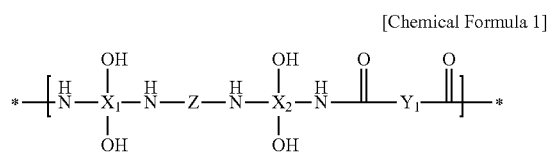

wherein, in the above Chemical Formula 1,
    $X_1$ and $X_2$ are the same or different and are independently an aromatic organic group or a tetravalent to hexavalent aliphatic organic group,
    $Y_1$ is an aromatic organic group or a divalent to hexavalent aliphatic organic group, and Z is

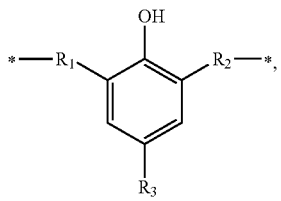

wherein:
$R_1$ and $R_2$ are the same or different and are each independently C1 to C6 alkylene, and
$R_3$ is C1 to C6 alkyl.

2. The positive photosensitive resin composition of claim 1, wherein the polybenzoxazole precursor further comprises a repeating unit represented by the following Chemical Formula 2, a repeating unit represented by Chemical Formula 3, or a combination thereof:

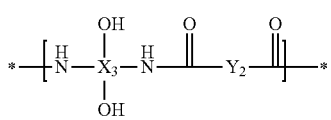
[Chemical Formula 2]

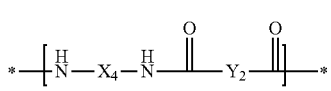
[Chemical Formula 3]

wherein, in the above Chemical Formulas 2 and 3,
$X_3$ is an aromatic organic group or a tetravalent to hexavelent aliphatic organic group,
$X_4$ is an aromatic organic group, a divalent to hexavalent aliphatic organic group, or a divalent to hexavalent alicyclic organic group, and
$Y_2$ is the same or different and are independently an aromatic organic group or a divalent to hexavalent aliphatic organic group.

3. The positive photosensitive resin composition of claim 2, wherein the polybenzoxazole precursor comprises a repeating unit represented by Chemical Formula 1 and a repeating unit represented by Chemical Formula 2, a repeating unit represented by Chemical Formula 3, or a combination thereof at a mole ratio of m:n, wherein m+n=100 mol %, m ranges from about 5 to about 100 mol %, and n ranges from about 0 to about 95 mol %.

4. The positive photosensitive resin composition of claim 3, wherein in the polybenzoxazole precursor, m ranges from about 5 to about 75 mol %, and n ranges from about 25 to about 95 mol %.

5. The positive photosensitive resin composition of claim 1, wherein the polybenzoxazole precursor has a weight average molecular weight (Mw) of about 3,000 to about 300,000.

6. The positive photosensitive resin composition of claim 1, wherein the repeating unit represented by Chemical Formula 1 of the polybenzoxazole precursor is derived from a diamine compound represented by the following Chemical Formula 4:

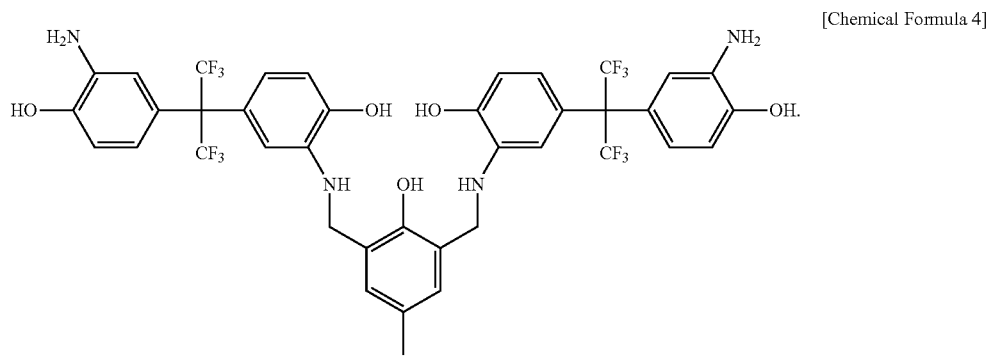
[Chemical Formula 4]

7. The positive photosensitive resin composition of claim 1, wherein the solvent comprises N-methyl-2-pyrrolidone, γ-butyrolactone, N,N-dimethyl acetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, or a combination thereof.

8. The positive photosensitive resin composition of claim 1, wherein the resin composition comprises about 5 to about 100 parts by weight of the photosensitive diazoquinone compound (B), about 0.1 to about 30 parts by weight of the silane compound (C), about 1 to about 30 parts by weight of the phenol compound (D), and about 100 to about 400 parts by weight of solvent (E), wherein the amounts of (B), (C), (D), and (E) are based on about 100 parts by weight of the polybenzoxazole precursor (A).

9. A photosensitive resin film made using the positive photosensitive resin composition of claim 1.

10. A semiconductor device including the photosensitive resin film of claim 9.

* * * * *

UNITED STATES PATENT AND TRADEMARK OFFICE
CERTIFICATE OF CORRECTION

PATENT NO. : 8,501,375 B2  
APPLICATION NO. : 13/241612  
DATED : August 6, 2013  
INVENTOR(S) : Hyun-Yong Cho et al.

Page 1 of 1

It is certified that error appears in the above-identified patent and that said Letters Patent is hereby corrected as shown below:

In the Specification

Column 12, Line 12 reads: "$n_{35}$ and $n_{35}$ are the same or different and are each indepen-"
and should read: "$n_{35}$ and $\underline{n_{36}}$ are the same or different and are each indepen-"

Column 14, Line 17 reads: "$n_{60}$ is an integer ranging from 1 to 5."
and should read: "$\underline{n_{68}}$ is an integer ranging from 1 to 5."

Column 15, Line 28 reads: "$n_{86}$, $n_{87}$ and $n_{89}$ are the same or different and are each"
and should read: "$\underline{n_{85}}$, $n_{87}$ and $n_{89}$ are the same or different and are each"

Column 15, Line 30 reads: "$n_{84}+n_{86}$, $n_{86}+n_{87}$ and $n_{88}+n_{89}$ are the same or different and"
and should read: "$n_{84}+\underline{n_{85}}$, $n_{86}+n_{87}$ and $n_{88}+n_{89}$ are the same or different and"

Column 17, Line 48 reads: "Synthesis of Polybenzoxazole Precursor P(BO-1)"
and should read: "Synthesis of Polybenzoxazole Precursor $\underline{(PBO-1)}$"

Signed and Sealed this  
Twelfth Day of November, 2013

Teresa Stanek Rea  
*Deputy Director of the United States Patent and Trademark Office*

UNITED STATES PATENT AND TRADEMARK OFFICE
CERTIFICATE OF CORRECTION

| | | Page 1 of 1 |
|---|---|---|
| PATENT NO. | : 8,501,375 B2 | |
| APPLICATION NO. | : 13/241612 | |
| DATED | : August 6, 2013 | |
| INVENTOR(S) | : Hyun-Yong Cho et al. | |

It is certified that error appears in the above-identified patent and that said Letters Patent is hereby corrected as shown below:

On the Title Page

Item (73), the Assignee reads: Cheil Industries Inc., Gumi-si (KR) and should read:
Cheil Industries Inc., Gumi-si (KR) and Samsung Electronics Co., Ltd., Suwon-si (KR)

Signed and Sealed this
Twenty-eighth Day of January, 2014

Michelle K. Lee
*Deputy Director of the United States Patent and Trademark Office*